(12) United States Patent
Steinbrenner et al.

(10) Patent No.: US 9,478,409 B2
(45) Date of Patent: Oct. 25, 2016

(54) METHOD FOR COATING A WORKPIECE

(71) Applicant: Infineon Technologies AG, Neubiberg (DE)

(72) Inventors: Juergen Steinbrenner, Noetsch (AT); Markus Kahn, Rangersdorf (AT); Helmut Schoenherr, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/594,193

(22) Filed: Jan. 12, 2015

(65) Prior Publication Data

US 2015/0340224 A1   Nov. 26, 2015

Related U.S. Application Data

(60) Provisional application No. 62/002,953, filed on May 26, 2014.

(51) Int. Cl.
*H01L 21/31* (2006.01)
*H01L 21/02* (2006.01)
*H01L 21/302* (2006.01)
*C23C 16/02* (2006.01)
*C23C 16/40* (2006.01)

(52) U.S. Cl.
CPC ..... *H01L 21/02126* (2013.01); *C23C 16/0209* (2013.01); *C23C 16/401* (2013.01); *H01L 21/02129* (2013.01); *H01L 21/02271* (2013.01); *H01L 21/02318* (2013.01); *H01L 21/302* (2013.01); *H01L 21/31* (2013.01)

(58) Field of Classification Search
CPC .............. B01J 2523/00; B01J 2523/55; B01J 2523/68; B01J 2523/69; B01J 2523/56; B01J 2523/53; B01J 2523/3712; B01J 2523/17; B01J 2523/47; B01J 2523/845; B01J 23/8885; B01J 35/023; B01J 2231/14
See application file for complete search history.

(56) References Cited

U.S. PATENT DOCUMENTS

2010/0055016 A1\* 3/2010 Kim ...................... B82Y 30/00
423/249
2011/0089469 A1\* 4/2011 Merckling ........ H01L 21/28264
257/201

\* cited by examiner

*Primary Examiner* — Robert Bachner

(57) ABSTRACT

In various embodiments, a method for coating a workpiece is provided. The method may include drying a workpiece, the workpiece being coated with at least one oxide layer as an uppermost layer; depositing a dielectric layer over the uppermost layer of the dried workpiece; wherein the workpiece is continuously subject to a pressure which is lower than atmospheric pressure during the drying process and during the depositing process.

14 Claims, 3 Drawing Sheets

METHOD FOR COATING A WORKPIECE

CROSS-REFERENCE TO RELATED APPLICATION

This application claims priority of U.S. provisional application Ser. No. 62/002,953, filed May 26, 2014, which is incorporated by reference herein in its entirety.

TECHNICAL FIELD

Various embodiments relate to method for coating a workpiece.

BACKGROUND

Semiconductor wafers with a LPCVD (low pressure chemical vapour deposition) TEOS (tetra-ethyl-ortho-silicate, also called tetraethoxysilane) show severe outgassing in processes, in which SABPSG (sub-atmospheric borophosphosilicate glass) layers are deposited thereon. In connection with vacuum chucks for fastening the semiconductor wafer to be processed, this may lead to problems as the outgassing may cause an azimuthally asymmetric wafer bow. The azimuthally asymmetric wafer bow may impede the vacuum chucking mechanism from proper operation, i.e. it may not be possible to hold the semiconductor wafer in its flat and predefined position for subsequent material depositing processes. Therefore, when a SABPSG layer is deposited on the azimuthally asymmetrically bowed semiconductor wafer, a rather large film non-uniformity has to be reckoned with which in effect may render the semiconductor wafer unusable. The outgassing of water from TEOS oxide during the chucking procedure at elevated temperatures in a SA-CVD (sub-atmospheric CVD) chamber may inhibit proper vacuum buildup below the wafer, which may affect the working principle and/or reliability of a vacuum chuck.

SUMMARY

In various embodiments, a method for coating a workpiece is provided. The method may include drying a workpiece, the workpiece being coated with at least one oxide layer as an uppermost layer; depositing a dielectric layer over the uppermost layer of the dried workpiece; wherein the workpiece is continuously subject to a pressure which is lower than atmospheric pressure during the drying process and during the depositing process.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The following detailed description is based on a semiconductor wafer, wherein the term "wafer" also referred to as "substrate". However, the method for coating a workpiece is not supposed to be limited in that respect. The workpiece may be of various shapes, sizes, and materials. In addition to semiconductor wafers, the method for coating a workpiece may be applied to objects, for example display front planes, printed circuit boards and the like.

Figure 1:
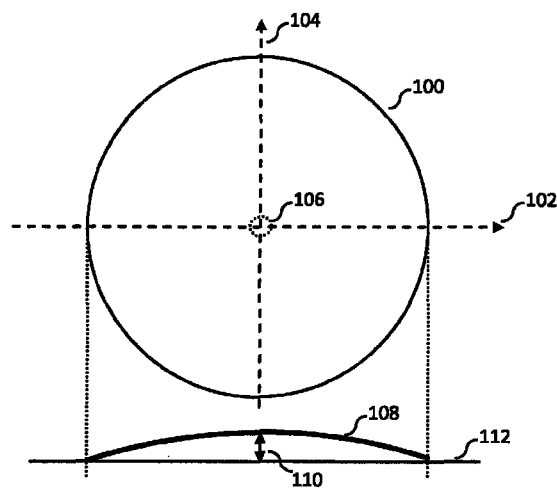
FIG. 1 shows a top view of a semiconductor wafer explaining the azimuthally asymmetric bow.

FIG. 1 shows a combined view of a top view and a side view of a semiconductor wafer 100. A coordinate system having a first axis 102 and a second axis 104 is placed on an upper surface 100 of the wafer. A crossing of the coordinate system is chosen to lie in the center 106 of the circular shaped wafer 100. Below the top view on the upper surface of the wafer 100, a side view thereof along the first axis 102 is shown.

A bow of a semiconductor wafer may be understood as a deviation of the median surface of the wafer in its free, unclamped state from a flat supporting plane underneath (for example, the flat surface, on which the wafer may be resting). In FIG. 1, the bow 110 is marked by the small arrow between the flat supporting plane 112 (which may, of course, be a virtual calculated plane) and the wafer 100 in side view. The median surface of a semiconductor wafer may be defined by points which lie within the wafer at equal distance from the upper surface and the lower surface thereof. It is to be added that the side view presented FIG. 1 is highly exaggerated for the sake of emphasis. The usual diameter of semiconductor wafers nowadays may be a few tens of centimeters, whereas the wafer bow may lie on the order of a few tens to a few hundreds of micrometers.

An azimuthally asymmetric wafer bow is present, when the wafer bow 110 measured along the first axis 102 is different from the wafer bow 110 when measured along the second axis 104. It is to be noted that the first axis 102 and the second axis 104, which form an orthogonal coordinate system in FIG. 1, do not necessarily need to be at right angle with respect to one another. An azimuthal asymmetry of the wafer bow 110 is present, if any two axes extending radially through the center 106 of the wafer 100 may be found, along which the wafer bow 110 is found to be different. In general, the value of the waver bow 100 may be positive or negative. If the wafer bow 110 has a positive value, the wafer 100 features an upward bow of its rim with respect to its center 106. In the other case, if the wafer bow 110 has a negative value, the wafer 100 features a downward bow of its rim with respect to its center 106. The latter scenario can be observed in FIG. 1 along the first axis, as the rim of the wafer 100 is bent downwards with respect to the center 106 of the wafer 100 in side view. A simple measure of the azimuthal asymmetry of the wafer bow may be the difference between the wafer bow calculated or determined (by means of a measuring device) along one axis, e.g. the first axis 102, and the wafer bow calculated or determined along another axis, e.g. the second axis 104. In the case of a semiconductor wafer with an azimuthally symmetric bow, i.e. when the wafer features an overall symmetric bow with its rim bent upwards or downwards with respect to its middle section, that difference indicating an azimuthally asymmetric bow would amount to zero.

Azimuthally asymmetric semiconductor wafers may prove problematic, especially in combination with vacuum chucks. A vacuum chuck is a fastening and/or holding mechanism which relies on the difference of pressure to hold a workpiece in place. The pressure within the vacuum chuck (also called vacuum chuck backside pressure), on which the workpiece rests, is lower than the pressure above the workpiece. The workpiece so to speak works as a seal by providing an airtight bather between the lower pressure region within the vacuum chuck and the higher pressure surrounding the vacuum chuck (which, of course, may still be placed within a vacuum chamber such that the higher pressure surrounding the vacuum chuck is still well below the normal atmospheric pressure of approximately 1 bar).

Vacuum chucks rely on the object to be fastened laying tightly against the surface of the vacuum chuck. Azimuthal asymmetry may prevent the wafer from laying tightly against the surface of the vacuum chuck such that the vacuum chuck backside pressure may increase above values which would still allow for good vacuum chucking. In effect, the wafer bow may lead to an uneven deposition of a material thereon, such that the deposited (coating) material may feature a larger non-uniformity. An excessive wafer bow may be observed, for example, when the uppermost layer of the semiconductor wafer to be coated is a TEOS layer which, for example, may have been deposited on the semiconductor wafer by means of LPCVD.

TEOS (also called tetra-ethyl-ortho-silicate or tetraethoxysilane is a silicon-containing compound which is liquid at room temperature. In semiconductor applications it may be used as a precursor to silicon dioxide. TEOS is often used in place of silane for applications that require good conformality, for example, when the wafer surface contains recessed features or other irregularities. Silicon dioxide films deposited using TEOS (also called TEOS oxide films or TEOS films) may be deposited by thermal or plasma-enhanced chemical vapor depositing processes, for example low pressure chemical vapour deposition (LPCVD) using a process gas containing TEOS and an oxidant, typically oxygen or ozone.

Figure 2:
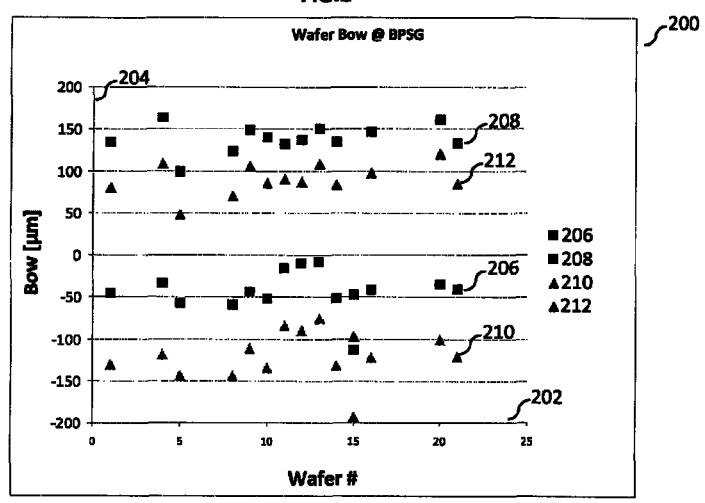
FIG. 2 shows a diagram examining the azimuthally asymmetric bow of a batch of semiconductor wafers.

In FIG. 2, a diagram 200 is shown in which a batch of multiple semiconductor wafers has been examined prior to and after a SABPSG depositing process. SABPSG is often used as a pre-metal dielectric in semiconductor applications. SABPSG has advantageous deposition properties such as excellent gap fill, low reflow temperatures, no dependency on the pattern of the metal layer deposited thereabove.

The x-axis 202 of the diagram 200 represents a wafer number, the y-axis 204 of the diagram 200 represents the bow of the respective wafer, given in micrometers. Four types of data are displayed in the diagram 200 for each wafer. A first set of data points 206 represents the bow of the respective wafer along a first axis, e.g. the first axis 102 as shown in FIG. 1, prior to the SABPSG depositing process. A second set of data points 208 represents the bow of the respective wafer along a second axis, e.g. the second axis 104 as shown in FIG. 1, prior to the SABPSG depositing process. A third set of data points 210 represents the bow of the respective wafer along the first axis after the SABPSG depositing process. A fourth set of data points 210 represents the bow of the respective wafer along the second axis after the SABPSG depositing process.

The first set of data 206 and the second set of data 208 imply that the examined batch of wafers already featured an azimuthally asymmetric wafer bow to some extent. Taking the 10th wafer as an example, its bow along the first axis prior to the SABPSG depositing process was about +140 µm and its bow along the second axis prior to the SABPSG depositing process was about −45 µm, as may be derived from the first set of data 206 and the second set of data 208 for that wafer. The difference between the bow along the first axis and the bow along the second axis was approximately therefore approximately 185 µm. After the SABPSG depositing process, the bow of that same wafer along the first axis was about −135 µm and its bow along the second axis was about +80 µm. Therefore, the difference between the bow along the first axis and the bow along the second axis after the SABPSG depositing process was approximately 215 µm, which is equivalent to an increase of approximately 16%. The corresponding data for all the other wafers in the sampled batch show a similar behaviour.

Figure 3:
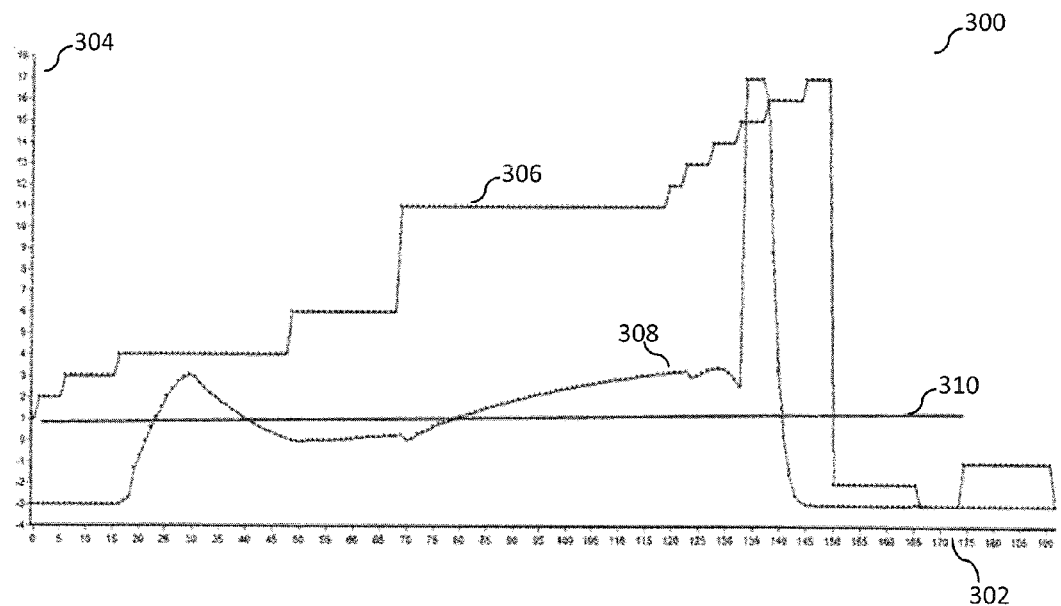
FIG. 3 shows a diagram examining the effect of the depositing of SABPSG on the backside pressure of a vacuum chuck.

The effect of an azimuthally asymmetric wafer bow on the vacuum chucking is demonstrated in diagram 300 in FIG. 3. The x-axis 302 of the diagram 300 denotes time in seconds, the y-axis 304 denotes a number of carried out process steps. The first graph 306 shows the temporal progress of process steps. The second graph 308 shows the evolution of the vacuum chuck backside pressure (the corresponding axis denoting the pressure scale is not shown). A line 310 marks the value of 10 torr (13.3 mbar) which will be referred to as functionality threshold in the following. In the underlying experimental environment, up to that pressure a sufficiently strong vacuum chucking may be assumed. A desired ratio between the vacuum chuck backside pressure and the pressure in the vacuum chamber may be, for example, about 1:50 or less. For example, in case of a pressure of about 200 torr (266 mbar) in the vacuum chamber, a desired vacuum chuck backside pressure may be about 4 torr (5.32 mbar) or less.

As may be taken from diagram 300, already in the fourth process step (at approximately 23 seconds into the procedure) the vacuum chuck backside pressure rises above the functionality threshold and then remains close below that threshold. Then, in the 11th process step (approximately 60 seconds into the procedure), the backside pressure rises above the functionality threshold again and remains thereabove. The 11th process step may, for example, include or correspond to a deposition process. At about 130 seconds into the procedure, the vacuum chuck backside pressure finally rises steeply well above the functionality threshold and from that point in time the vacuum chuck mechanism may be considered non-functional.

It has been observed that the problem of an azimuthally asymmetric wafer bow or a too high total amount of absorbed humidity is not observed in the 200 mm product line, i.e. in a processing line of semiconductor wafers with a diameter of 200 mm. The azimuthally asymmetric wafer bow seems to be an issue which may be closely linked to the larger wafer size in the 300 mm product line. It has been further examined that efforts to add an RTA (rapid thermal annealing) process step to cure the added azimuthally asymmetric bow of wafers having a LPCVD TEOS oxide layer (i.e. a TEOS oxide layer deposited by means of LPCVD) did not prove helpful.

It has been further investigated that a TEOS oxide layer tends to outgas humidity, i.e. water, in vacuum environment, which is intrinsically incorporated in that type of films. Even when the wafer carrying the TEOS oxide layer was annealed in an RTA process step at about 800 C, the (increased) azimuthally asymmetric wafer bow could not be prevented, since the film quickly reabsorbed humidity during exposure to air after the RTA process. The observations made so far lead to the assumption that humidity, i.e. water molecules, incorporated in the TEOS oxide layer can be responsible for the azimuthally asymmetric wafer bow.

The method for coating a workpiece according to various embodiments aims at reducing the amount of humidity, i.e. the volume of water, incorporated in the oxide layer, e.g. an LPCVD TEOS oxide layer. Therefore, the wafer including the LPCVD TEOS oxide layer may be dried in the chamber, in which the subsequent layer, for example an SABPSG layer, is to be deposited, wherein the wafer may not be unloaded to atmosphere in between the process steps. In other words, after a drying step of the wafer including the LPCVD TEOS oxide layer, a subsequent layer, e.g. the SABPSG layer, may be deposited immediately thereafter on top of the LPCVD TEOS oxide layer. By doing so, the re-absorption of humidity from the surrounding air into the oxide layer may be prevented, as the wafer stays in the vacuum chamber at a base pressure of about 0.1 Torr throughout the drying process and the subsequent depositing process.

According to one exemplary embodiment of the method for coating a workpiece, the drying process may take place in the coating chamber, e.g. in the SABPSG chamber (i.e. the chamber, where the SABPSG layer is to be deposited on the oxide layer, e.g. the LPCVD TEOS oxide layer), where the wafer may rest for approximately 2 minutes at a drying temperature of approximately 480° C.; other time durations and/or drying temperatures may be used as well, depending, for example, on the process flow (e.g., film volume and/or humidity content). Once the oxide film, e.g. the LPCVD TEOS oxide layer, is dry, the wafer bow is relaxed/reduced and the wafer can then be properly chucked by the vacuum chuck mechanism. This, in turn, enables a deposition of a subsequent layer, e.g. a SABPSG layer, on the oxide layer with a uniform layer thickness with a non-uniformity below 5%.

Figure 4:
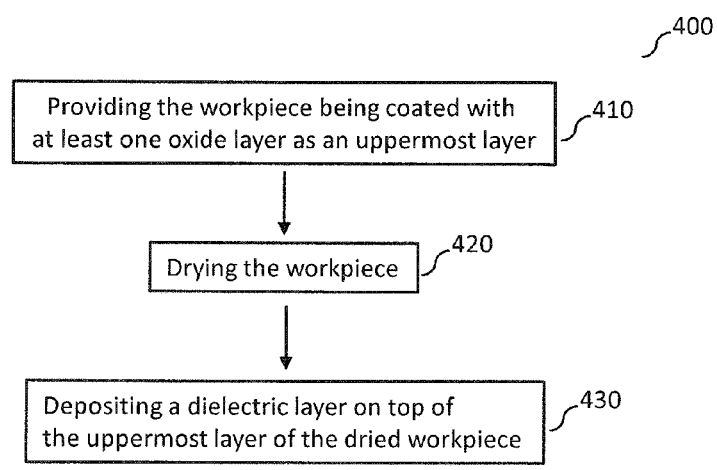
FIG. 4 shows the method for coating a workpiece according to various embodiments.

The method for coating a workpiece according to various embodiments is depicted in FIG. 4 in more detail based on a flow diagram 400. In a first step, the method for coating a workpiece may include providing the workpiece, the workpiece being coated with at least one oxide layer as an uppermost layer. In a next step the method for coating a workpiece according to various embodiments may include drying the workpiece. In a next step, the method for coating a workpiece according to various embodiments may include depositing a dielectric layer on top of the uppermost layer of the dried workpiece, wherein during the drying process and during the depositing process the workpiece is continuously subject to a pressure which is lower than the atmospheric pressure.

In general, the drying process may take place in the same vacuum chamber as the depositing process or in a vacuum chamber different from the chamber in which a subsequent layer may be deposited on the wafer (deposition chamber). In case a separate drying chamber is used, it may be integrated in the same equipment mainframe as the deposition chamber such that after the drying process, the wafer may be transferred from the drying chamber to the deposition chamber without coming in contact with the atmosphere from which humidity may be absorbed into the oxide layer.

Figure 5:
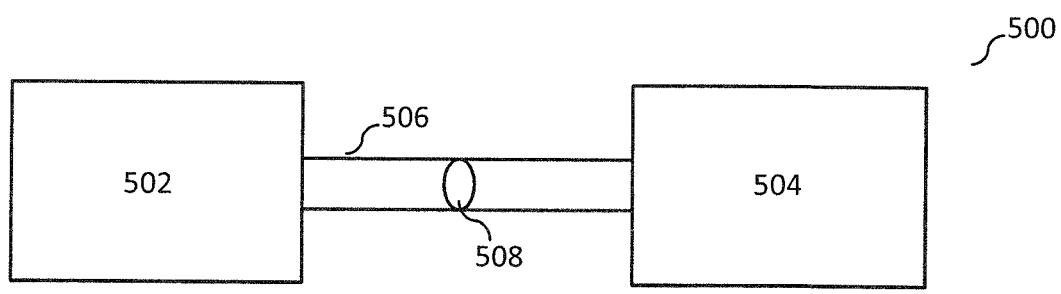
FIG. 5 shows an exemplary vacuum system according to various embodiments.

An exemplary vacuum system 500 which may be used for the process described above is shown in FIG. 5. In this example, the vacuum system 500 includes a first chamber 502 and a second chamber 504 which may be connected to one another by a tube 506. The first chamber 502 may be the drying chamber and the second chamber 504 may be the deposition chamber. Within the tube 506, a vacuum lock 508 may be provided. However, the vacuum lock 508 may be also provided in the first chamber 502 or in the second chamber 504 or in both, depending on the overall pressure configuration of the vacuum system 500. The vacuum lock 508 may be closed during the drying of the wafer in the first chamber 502 and during the depositing process in the second chamber 504. The vacuum lock 508 may be opened for the transfer of the wafer between the two chambers. For the purpose of performing the method for coating a workpiece according to various embodiments, the pressure within the first chamber 502 and the pressure within the second chamber 504 are lower than the ordinary atmospheric pressure. The pressure within the first chamber 502 may be the same as or different from the pressure in the second chamber 504. The tube 506 may be configured as a vacuum tight tube and the pressure within the tube 506 may correspond to the pressure in the first chamber 502 and/or to the pressure within the second chamber 504 (in the latter case, two vacuum locks 508 may be employed in order to be able to maintain the interior of the tube 506 and one chamber at the same pressure and the other chamber at a different pressure). In the vacuum system 500 as shown in FIG. 5, the transfer of the wafer may take place through the vacuum tight tube 506 such that the wafer may be prevented from coming into contact with atmosphere air during the transfer thereof between the two processing chambers. The drying chamber 502 may be also perceived as an outgassing chamber, in which the wafer may be rested for a period of time of approximately 2 minutes at about 480° C. for the humidity inherently incorporated in the LPCVD TEOS oxide layer to outgas, although other time periods and/or temperatures may be used as well for the outgassing. In general, the outgassing chamber may be configured as a vacuum chamber which may be adapted for a specified temperature or temperature range, and which may allow at least for an inert flow.

The method for coating a workpiece according to various embodiments provides a solution to avoid further azimuthally asymmetric bow of wafers including a TEOS oxide layer deposited thereon by means of LPCVD. The method includes an in-situ drying step of the oxide layer prior to the deposition of a further layer thereon, e.g. an SABPSG layer. Within this context, in situ refers to a method or process step applied to the wafer directly at the location where it is processed without exposure to an external environment, i.e. the atmosphere (air). The in-situ condition may be satisfied by drying the wafer in the deposition chamber, in which the subsequent deposition takes place, or in a separate drying or outgassing chamber, which may be integrated in the same equipment mainframe. The term equipment mainframe may refer to the vacuum and processing equipment which is connected to one another via airtight connections (e.g. vacuum tubes), such that a workpiece may be transferred from one site to another without coming in contact with the atmosphere (air). Another aspect of various embodiments may be seen in that a way is provided to outgas water from a TEOS oxide layer on a wafer in a SA-CVD chamber prior to a deposition process in order to properly chuck the wafer.

It is to be noted that even though the method for coating a workpiece has been described with specific reference to a wafer having a LPCVD TEOS oxide layer on which a SABPSG layer is to be deposited, the method for coating a workpiece is not to be conceived as being limited solely to a process involving those two kinds of materials and/or layers. The method for coating a workpiece may be rather applied to any semiconductor workpiece which may show excessive bow, for example an asymmetric bow, for example an azimuthally asymmetric bow, during the subsequent coating process which may be caused by humidity. According to the method for coating a workpiece, the uppermost layer of the semiconductor workpiece may be dried prior to the deposition of the subsequent layer without letting the semiconductor workpiece come in contact with the atmosphere (air) between the two process steps.

In accordance with various embodiments, a method for coating a workpiece may include In various embodiments, a method for coating a workpiece is provided. The method may include drying a workpiece, the workpiece being coated with at least one oxide layer as an uppermost layer; depositing a dielectric layer over the uppermost layer of the dried workpiece; wherein the workpiece is continuously subject to a pressure which is lower than atmospheric pressure during the drying process and during the depositing process.

According to further embodiments of the method, the workpiece may include a semiconductor wafer.

According to further embodiments of the method, the uppermost oxide layer may include a tetraethylorthosilicate layer.

According to further embodiments of the method, the uppermost oxide layer may include a low pressure chemical vapour deposited tetraethylorthosilicate layer.

According to further embodiments of the method, the dielectric layer may include a borophosphosilicate glass.

According to further embodiments of the method, the dielectric layer may include a sub-atmospheric borophosphosilicate glass.

According to further embodiments of the method, the drying process and the depositing process may take place in the same vacuum chamber.

According to further embodiments of the method, the drying process and the depositing process may take place in different vacuum chambers.

According to further embodiments of the method, the workpiece may not be unloaded to atmosphere between the drying process and the depositing process.

According to further embodiments of the method, the workpiece is held in place with a vacuum chuck during the depositing process.

According to further embodiments of the method, the drying process may be performed at a temperature of at least 470° C.

According to further embodiments of the method, the drying process may be performed for at least 1 minute.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for coating a workpiece, the method comprising:
providing a workpiece coated with at least one oxide layer as an uppermost layer;
drying the workpiece, wherein during the drying of the workpiece humidity incorporated in the oxide layer outgasses;
after drying the workpiece, chucking the dried workpiece by a vacuum chuck;
depositing a dielectric layer over the uppermost layer of the dried workpiece, wherein the dried workpiece is held in place with the vacuum chuck during the depositing process;
wherein the workpiece is continuously subject to a pressure which is lower than atmospheric pressure during the drying process, during the chucking process, and during the depositing process.

2. The method of claim 1, wherein the workpiece includes a semiconductor wafer.

3. The method of claim 1, wherein the uppermost oxide layer includes a tetraethylorthosilicate layer.

4. The method of claim 1, wherein the uppermost oxide layer includes a low pressure chemical vapour deposited tetraethylorthosilicate layer.

5. The method of claim 1, wherein the dielectric layer includes a borophosphosilicate glass.

6. The method of claim 1, wherein the dielectric layer includes a sub-atmospheric borophosphosilicate glass.

7. The method of claim 1, wherein the drying process and the depositing process take place in the same vacuum chamber.

8. The method of claim 1, wherein the drying process and the depositing process take place in different vacuum chambers.

9. The method of claim 1, wherein the workpiece is not unloaded to atmosphere between the drying process and the depositing process.

10. The method of claim 1, wherein the drying process is performed at a temperature of at least 470° C.

11. The method of claim 1, wherein the drying process is performed for at least 1 minute.

12. The method of claim 1, wherein drying the workpiece comprises drying the at least one oxide layer so as to reduce or relax wafer bow of the workpiece.

13. The method of claim 1, wherein the dielectric layer has a uniform layer thickness with a non-uniformity that is less than 5%.

14. The method of claim 1, wherein the workpiece is subjected to a base pressure of about 0.1 Torr throughout the drying process and the depositing process.

* * * * *